(12) United States Patent
Zitlaw

(10) Patent No.: US 8,806,071 B2
(45) Date of Patent: Aug. 12, 2014

(54) CONTINUOUS READ BURST SUPPORT AT HIGH CLOCK RATES

(75) Inventor: Clifford Alan Zitlaw, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 148 days.

(21) Appl. No.: 13/357,842

(22) Filed: Jan. 25, 2012

(65) Prior Publication Data

US 2013/0191558 A1    Jul. 25, 2013

(51) Int. Cl.
*G06F 9/44* (2006.01)
*G06F 13/38* (2006.01)

(52) U.S. Cl.
CPC .. *G06F 9/44* (2013.01); *G06F 13/38* (2013.01)
USPC ............. 710/8; 710/2; 710/5; 710/52; 710/64

(58) Field of Classification Search
None
See application file for complete search history.

(56) References Cited

U.S. PATENT DOCUMENTS

2008/0037428 A1* 2/2008 Nation et al. ................. 370/235

* cited by examiner

*Primary Examiner* — Scott Sun

(57) ABSTRACT

A memory device includes a memory array, an output buffer, an initial latency register, and an output signal. Often times a host device that interfaces with the memory device is clocked at high rate such that data extraction rates of the memory device are not adequate to support a gapless data transfer. The output signal is operable to stall a transmission between the memory device and the host device when data extraction rates from the memory array are not adequate to support output rates of the output buffer.

20 Claims, 5 Drawing Sheets

CONTINUOUS READ BURST SUPPORT AT HIGH CLOCK RATES

FIELD

Embodiments according to the present invention generally relate to memory devices.

BACKGROUND

Generally, memory refers to computer components and recording media that retain digital data. Data storage is one of the core functions and fundamental components of computers. Depending on the exact configuration and type of computing device, system memory may be volatile (such as RAM), non-volatile (such as ROM, flash memory, etc.), or some combination of the two. Memory devices typically interface and transact with a host device within a computer system.

There are times when it is desirable for a host device within a computer system to use a high clock rate. A faster clock rate is attractive for a number of reasons. With a faster clock rate, the time taken to specify serialized command and address information for a transaction is minimized, allowing the specified command operation to begin earlier. Additionally, with a faster clock rate, the time taken to transfer data across a data bus between the memory device and a host is minimized. Furthermore, with a faster clock rate, the total amount of time taken for an entire read or write transaction is shortened allowing the memory device to return to a standby state, freeing up the data bus for the next transaction. Unfortunately, often times the host device is clocked at a high rate such that data output rates of the memory device are not adequate to support a gapless data transfer.

BRIEF DESCRIPTION OF THE DRAWINGS

Embodiments of the present invention are illustrated by way of example, and not by way of limitation, in the figures of the accompanying drawings.

DETAILED DESCRIPTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Embodiments of the present invention relate to a memory device for use in a computing system. The memory device includes a memory array, an initial latency register, an output buffer, and an output signal. The memory array is operable for storing data. The initial latency register is operable for storing a user defined latency time. The output buffer is coupled to the memory array and stores the data from the memory array prior to a transmission of the data to a host device within the computing system. An output signal is used to stall the transmission until the data from the memory array is stored into the output buffer. The memory device allows for support of a continuous burst read operation when data extraction rates from the memory array are not adequate to support output rates of the output buffer, typically when a high clock rate is used.

Figure 1:
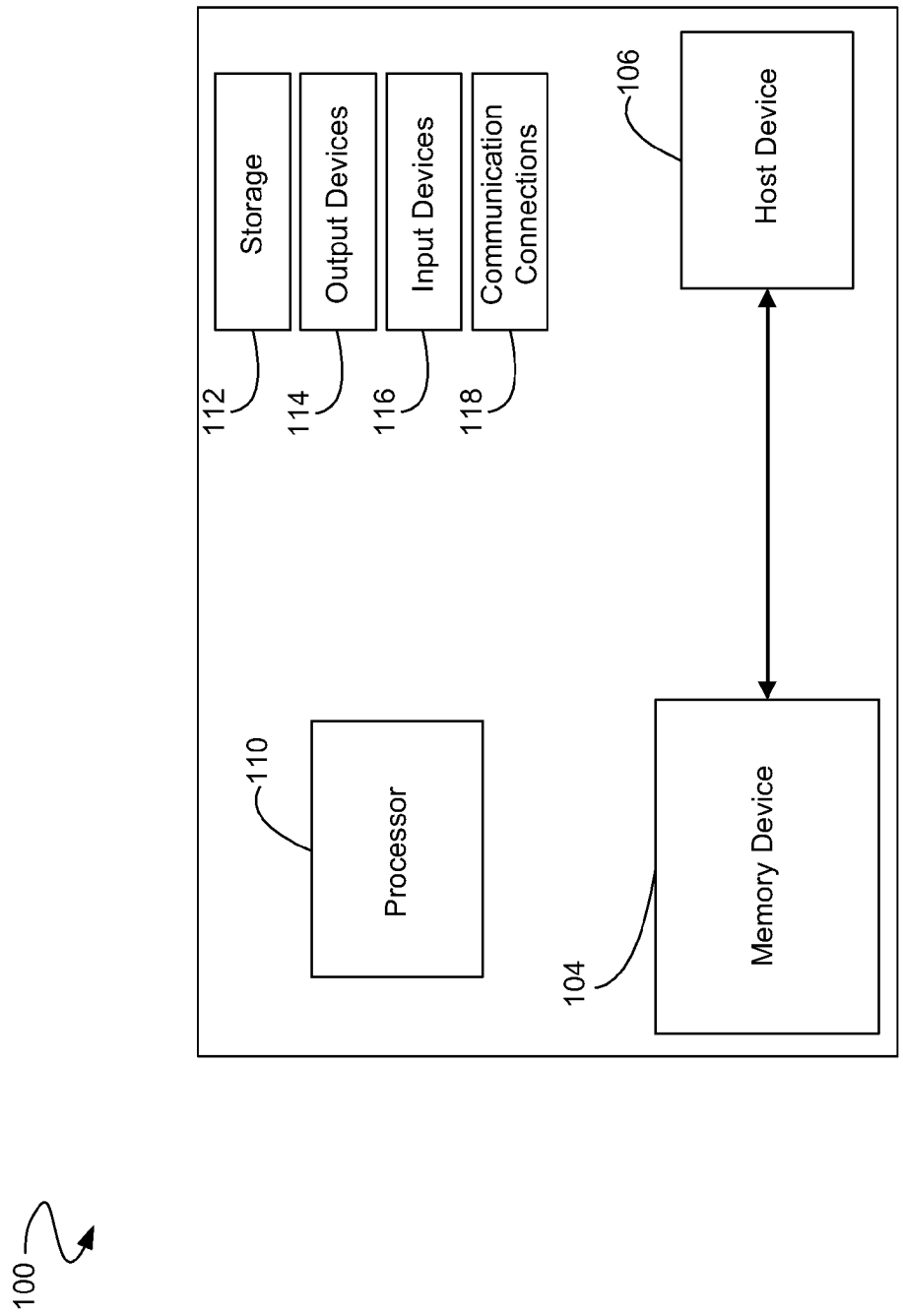
FIG. 1 is a block diagram of a computing system, upon which embodiments of the present claimed subject matter can be implemented.

FIG. 1 is a block diagram of a computing system 100, upon which embodiments of the present claimed subject matter can be implemented. Although computing system 100 is shown and described in FIG. 1 as having certain numbers and types of elements, the embodiments are not necessarily limited to the exemplary implementation. That is, computing system 100 can include elements other than those shown, and can include more than one of the elements that are shown. For example, computing system 100 can include a greater number of processing units than the one processor 110 shown. Similarly, in another example, computing system 100 can include additional components not shown in FIG. 1.

In its most basic configuration, computing system 100 typically includes at least one processor 110 and a memory device 104. Depending on the exact configuration and type of computing device, memory device 104 may be volatile (such as RAM), non-volatile (such as ROM, flash memory, etc.) or some combination of the two. The computing system 100 may also include additional storage 112 (removable and/or non-removable) including, but not limited to magnetic or optical disks or tape. Storage media includes volatile and non-volatile storage, removable and non-removable storage implemented in any method or technology for storage of information such as computer readable instructions, data structures, program modules or other data. By way of example, and not limitation, storage media includes RAM, ROM, EEPROM, flash memory or other memory technology, CD-ROM, digital video disks (DVD) or other optical storage, magnetic cassettes, magnetic tape, magnetic disk storage or other magnetic storage devices, or any other medium which can be used to store the desired information and which can accessed by computing system 100.

Additionally, computing system 100 may include a host device 106 coupled to the memory device 104 via a bus, the bus facilitating transactions between the host device 106 and memory device 104. In the present embodiment, the memory device 104 comprises an output buffer 220 (see FIG. 2), an initial latency register 221 (see FIG. 2), and a memory array 222 (see FIG. 2). As discussed below, the memory device 104 allows for support of a continuous burst read operation when data extraction rates from the memory array 222 (see FIG. 2) are not adequate to support output rates of the output buffer 220 (see FIG. 2).

The computing system 100 may also include communication connection(s) 118 that allow the computing system 100 to communicate with other systems. Communication connection(s) 118 is an example of a communication media. By way of example, and not limitation, communication media includes wired media such as a wired network or direct-wired connection, and wireless media such as acoustic, RF, infrared and other wireless media.

The computing system 100 may include input device(s) 116 such as a keyboard, mouse, pen, voice input device, game input device (e.g., a joy stick, a game control pad, and/or other types of game input device), touch input device, etc. Additionally, the computing system 100 may also include output device(s) 114 such as a display (e.g., a computer monitor and/or a projection system), speakers, printer, network peripherals, etc.

Figure 2:
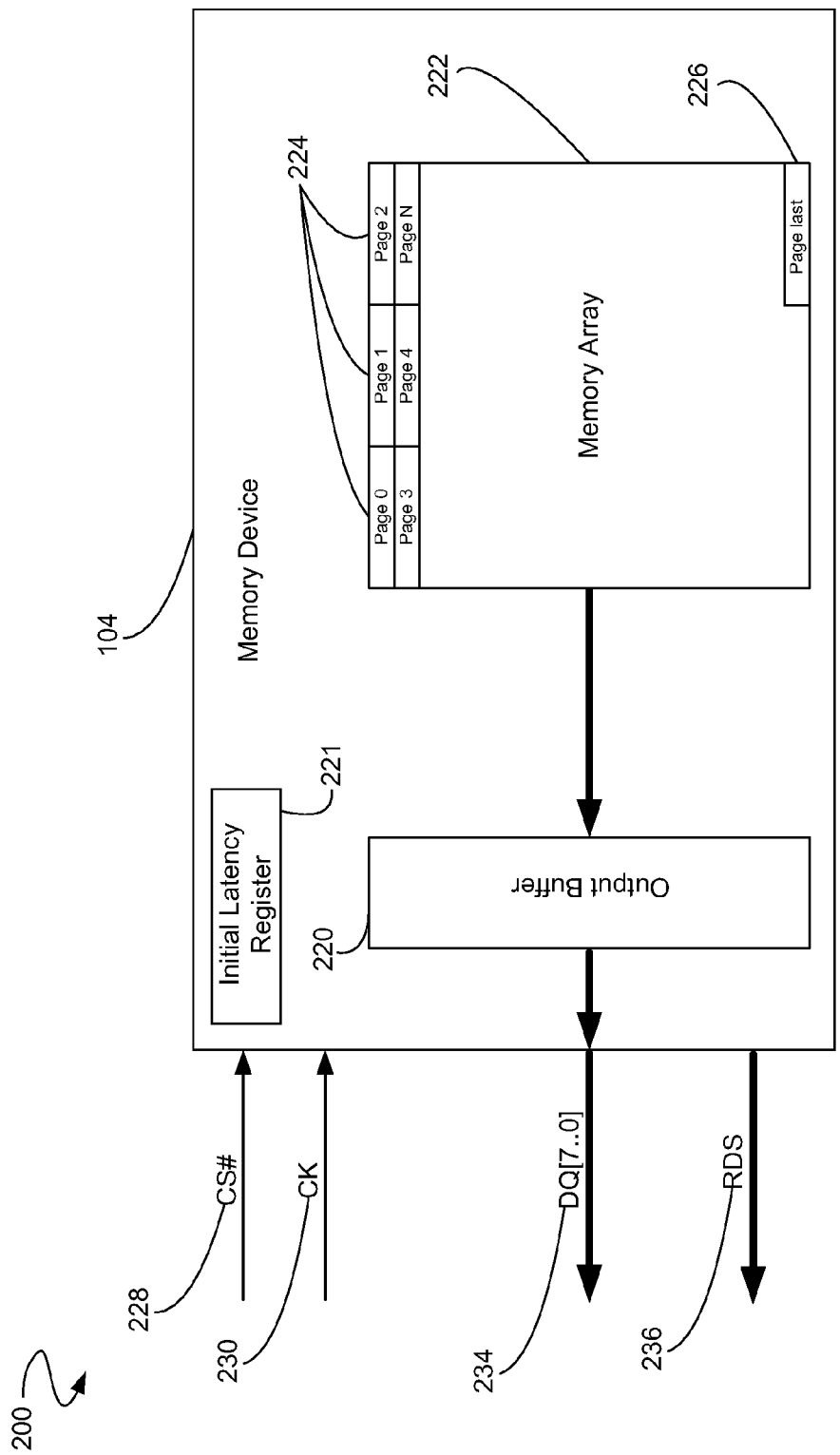
FIG. 2 is a block diagram of an exemplary memory device, according to an embodiment of the present invention.

FIG. 2 is a block diagram of an exemplary memory device, according to an embodiment of the present invention. In an embodiment, the memory device 104 includes an output buffer 220, an initial latency register 221, and a memory array 222. The memory device 104 interfaces with a host device 106 (FIG. 1) via a number of input and output and signals. The input and output signals used by the memory device 104 to interface with host device 106 (FIG. 1) include a select signal 228, a clock signal 230, an eight-bit data bus 234, and an output signal 236. In an embodiment, the output signal 236 is a read data strobe.

The memory array 222 is operable for storing data within the memory device 104. The memory array 222 stores data sequentially within a number of fixed-length contiguous blocks of virtual memory, called pages 224. In an embodiment, a page 224 may be 32 Bytes of data in length. The memory array 222 is coupled to an output buffer 220.

The memory device 104 may transmit data to a host device 106 (FIG. 1) in response to a read request initiated by the host device 106 (FIG. 1). Prior to the transmission, the host device 106 (FIG. 1) specifies a command to be performed and a target address within the memory array 222 at which to begin the transmission. The host device 106 (FIG. 1) may send a clock signal 230 at a high frequency to the memory device 104 such that a data extraction rate from the memory array 222 is not adequate to support an output data rate from the output buffer 220.

The output buffer 220 serves to temporarily store pages 224 of data residing in the memory array 222 prior to transmission of the page or a partial page of data to a host device 106 (FIG. 1). Each page 224 of data is extracted from the memory array 222 and stored into the output buffer 220. In a multi-page transfer, after extracting and storing the first page 224 of data into the output buffer 220, it is advantageous to shift that page 224 of data onto the data bus 234 destined for the host device 106 (FIG. 1) while simultaneously extracting the next page 224 of data from the memory array 222 to be stored into the output buffer 220. However, as previously mentioned, the host device 106 (FIG. 1) may send a clock signal 230 at a high frequency to the memory device 104 such that a data extraction rate from the memory array 222 is not adequate to support an output data rate from the output buffer 220.

The initial latency register 221 is used to store a user-defined parameter. In an embodiment, this user-defined parameter is a latency time. The latency time is the number of clock cycles required to access the memory array 222. If the latency time is smaller than the number of clock cycles required for the output buffer 220 to output a page 224 of data on to the data bus 234, each page 224 will be able to be extracted, stored, and transferred without a gap in the transmission. However, if the latency time is larger than the number of clock cycles required for the output buffer 220 to output a page 224 of data on to the data bus 234, some sort of management is required to sustain a gapless data transfer. A gapless data transfer is a transfer where there is no delay in transmission between the end of a page of data and the beginning of a subsequent page of data. In an embodiment of the present invention, the output signal 236 is operable to provide the timing management required to sustain a gapless data transfer.

The output signal 236 is generated by the memory device 104 and is operable to stall the transmission to ensure a gapless transfer of each page 224 of data to a host device 106 (FIG. 1). In an embodiment, the output signal is a read data strobe. During times when the output buffer 220 is waiting for the next page 224 of data from the memory array 222, the output signal 236 will remain idle. The output signal 236 will remain idle until the next page 224 of data reaches the output buffer 220 and is placed on the data bus 234. Once the next page 224 of data is available in the output buffer 220, the next page 224 of data will be driven onto the data bus 234 and the output signal 236 will toggle at a predetermined frequency. By stalling the transmission, the memory device 104 ensures a gapless data transfer to a host device 106 (FIG. 1) while the host continues to clock the memory device 104.

Figure 3:
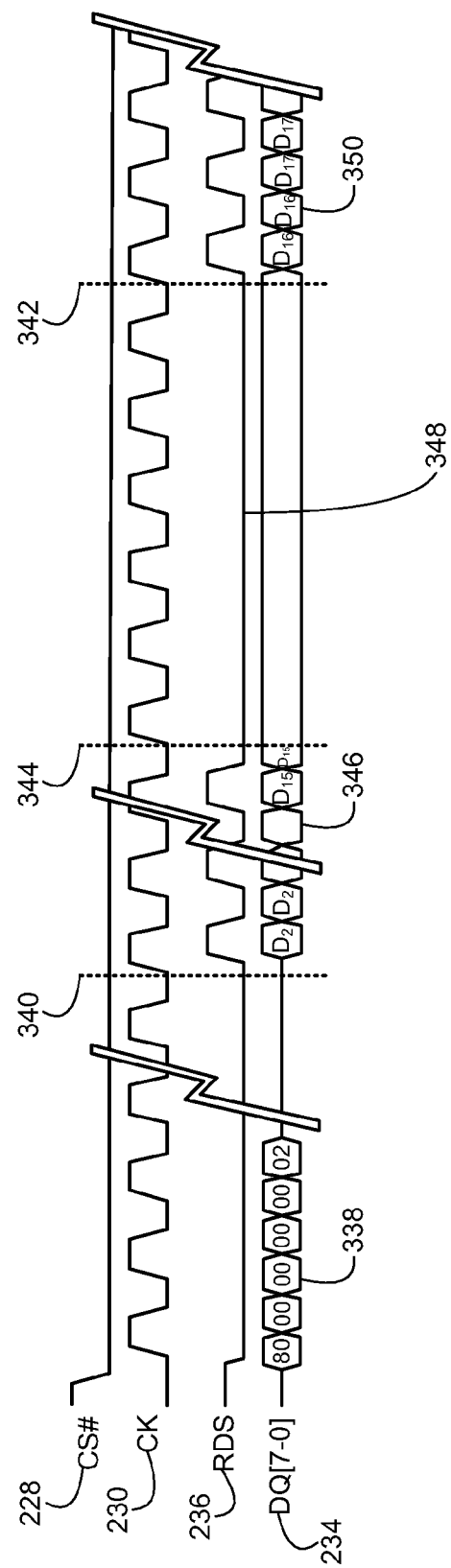
FIG. 3 is a timing diagram illustrating function of a memory device, according to an embodiment of the present invention.

FIG. 3 is a timing diagram illustrating function of a memory device, according to an embodiment of the present invention. The timing diagram illustrates the specifics of the stalling mechanism provided by the memory device 104 (FIG. 1). A host device 106 (FIG. 1) provides a clock signal 230 to the memory device. The clock signal 230 continues to oscillate at a predetermined frequency. When the host device 106 (FIG. 1) initiates a read request from the memory device 104 (FIG. 1), an active low select signal 228 is deasserted to select the memory device 104 (FIG. 1) in a computer bus. A data bus 234 is operable to transmit data between the memory device 104 (FIG. 1) and host device 106 (FIG. 1).

A transaction between the host device 106 (FIG. 1) and the memory device 104 (FIG. 1) begins with a read request from the host device 106 (FIG. 1). The host device 106 (FIG. 1) provides an initial address 338 at which to begin a read operation of the data. After specifying the initial address 338 at which begin the read operation of the data, the memory device 104 (FIG. 1) may start transmitting the initial page 346 of requested data to the host device 106 (FIG. 1). In an embodiment, the initial page 346 of data may be 32 Bytes in length. In another embodiment, the memory device 104 (FIG. 1) uses an x8 DDR interface resulting in a 16 clock requirement to output a 32 Byte page 224 (FIG. 2) of data. If the number of clock cycles taken to retrieve a 32 Byte page 224 (FIG. 2) of data from the memory array 222 (FIG. 2) is longer than the number of clock cycles required to output the data, a pause 348 must be inserted into the continuous burst between each 32 Byte page 224 (FIG. 2) transfer.

Prior to initiation of a transfer by the host device 106 (FIG. 1), an output signal 236 remains in an idle state. There are two scenarios requiring pause insertion. The first occurs at the beginning of a transfer from the memory device 104 (FIG. 1), requiring an initial page of data 346 from the memory array 222 (FIG. 2). At the beginning of the initial page transfer 340, the output signal 236 transitions from an idle state to an oscillating state. The output signal 236 continues oscillating until the end of the initial page transfer 344. The initial page of data 346 is extracted from the memory array 222 (FIG. 2) starting at the initial address 338, stored in the output buffer 220 (FIG. 2), and transmitted to the host device 106 (FIG. 1) between the beginning of the initial page transfer 340 and the end of the initial page transfer 344. The pause 348 required for the initial page of data 346 is dependent upon the initial address 338 for the burst transmission, page 224 (FIG. 2) size, as well as the latency time stored in the initial latency register 221 (FIG. 2).

In this particular example, the initial address 338 for the read request is 0x02, leaving 30 Bytes of the initial page 346 to be transmitted. In an embodiment, a latency time stored in the initial latency register 221 (FIG. 2) may be 20 clock cycles. There are 14 clock cycles between the beginning of the initial page transfer 340 and the end of the initial page transfer 344. Assuming an x8 DDR interface, 16 clocks are required to output a 32 Byte page 224 (FIG. 2) of data. The pause 348 required between an initial page of data 346 and a subsequent page of data 350 is calculated using the following formula: Initial_Boundary_Crossing_Pause_Clocks= Latency_Cap_Clocks−(Output_Clocks−(Initial_Address mod Output_Clocks)). In this particular example, there is a pause 348 of 6 clock cycles [6=(20−(16−(2 mod 16)))]. A 6 clock cycle pause 348 is required between the end of the initial page transfer 344 and the beginning of a subsequent page transfer 342. At the beginning of the pause 348, the output signal 236 changes from an oscillating state back to an idle state. This pause ensures that the data transfer is stalled until a subsequent page of data 350 has filled the output buffer 220 (FIG. 2) and is ready to be placed on the data bus 234. Without stalling the data transfer, the output buffer 220 (FIG. 2) will be starved when waiting for a subsequent page of data 350, since data extraction rates from the memory array 222 (FIG. 2) are not adequate to match the output buffer 220 (FIG. 2) output rate. By stalling the data transfer there will be no starvation of the output buffer 220 (FIG. 2).

Figure 4:
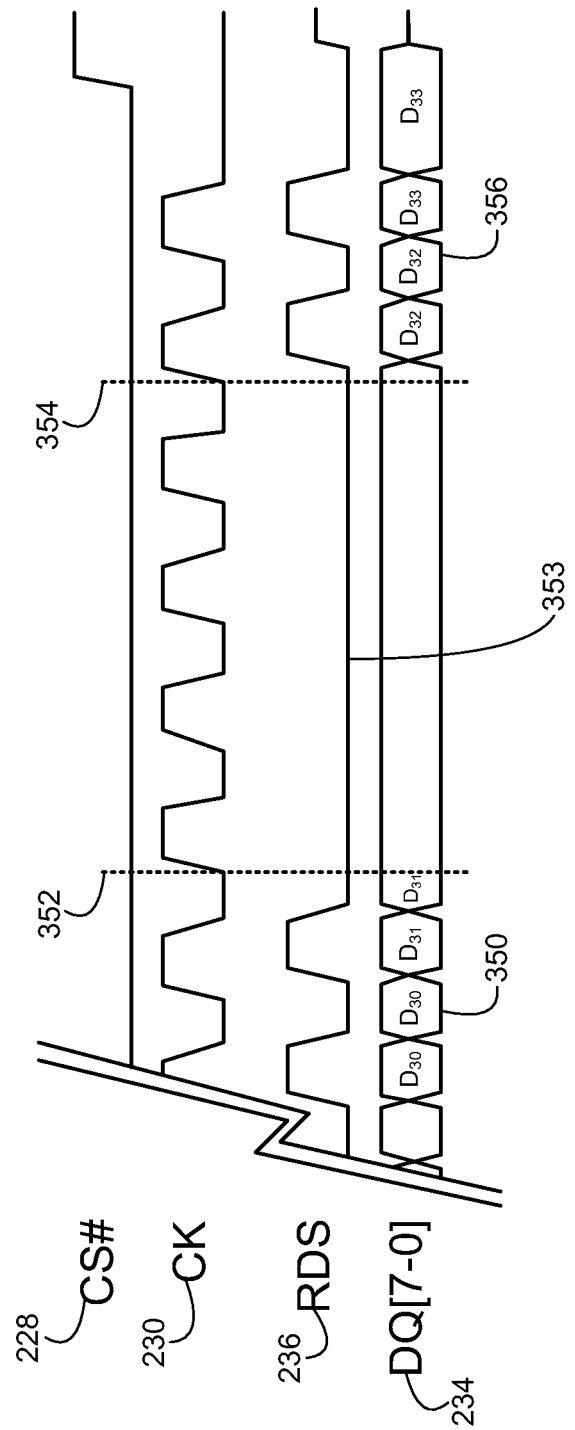
FIG. 4 is another timing diagram illustrating function of a memory device, according to an embodiment of the present invention.

FIG. 4 is another timing diagram illustrating function of a memory device, according to an embodiment of the present invention. The timing diagram illustrates the specifics of the stalling mechanism provided by the memory device 104 (FIG. 1). A host device 106 (FIG. 1) provides a clock signal 230 to the memory device 104 (FIG. 1). The clock signal 230 continues to oscillate at a predetermined frequency. When the host device 106 (FIG. 1) initiates a read request from the memory device 104 (FIG. 1), an active low select signal 228 is deasserted to select the memory device 104 (FIG. 1) in a computer bus. A data bus 234 is operable to transmit data between the memory device 104 (FIG. 1) and host device 106 (FIG. 1).

The second scenario requiring pause insertion occurs after an initial page of data 346 has been extracted from the memory array 222 (FIG. 2), stored in the output buffer 220 (FIG. 2), and placed on the data bus 234. At the end of the initial page transfer 344 (FIG. 3), the output signal 236 transitions from an oscillating state to an idle state. The output signal 236 remains idle until the beginning of a subsequent page transfer 342 (FIG. 3). The subsequent page of data 350 is extracted from the memory array 222 (FIG. 2) starting at the beginning of the page 224 (FIG. 2), stored in the output buffer 220 (FIG. 2), and transmitted to the host device 106 (FIG. 1) between the beginning of the subsequent page transfer 342 and the end of the subsequent page transfer 352. The pause required for the subsequent page of data 350 is dependent upon the page 224 (FIG. 2) size as well as the latency time stored in the initial latency register 221 (FIG. 2).

In this particular example, all subsequent pages of data after the initial page of data 346 (FIG. 3) can be assumed to have used the full 16 clocks to output the data to the host device 106 (FIG. 1). In an embodiment, a latency time stored in the initial latency register 221 (FIG. 2) may be 20 clock cycles. There are 16 clock cycles between the beginning of the subsequent page transfer 342 (FIG. 3) and the end of the subsequent page transfer 352. Assuming an x8 DDR interface, 16 clocks are required to output a 32 Byte page 224 (FIG. 2) of data. The pause 348 required between the subsequent page of data 350 and a next subsequent page of data 356 is calculated using the following formula: Subsequent_Boundary_Crossing_Pause_Clocks=Latency_Cap_Clocks−Output_Clocks. In this particular example, there is a pause 353 of 4 clock cycles [4=20−16]. A 4 clock cycle pause 353 is required between the end of the subsequent page transfer 352 and the beginning of a next subsequent page transfer 354. At the beginning of the pause 353, the output signal 236 changes from an oscillating state back to an idle state. This pause ensures that the data transfer is stalled until a next subsequent page of data 356 has filled the output buffer 220 (FIG. 2) and is ready to be placed on the data bus 234. Without stalling the data transfer, the output buffer 220 (FIG. 2) will be starved when waiting for a subsequent page of data 350, since data extraction rates from the memory array 222 (FIG. 2) are not adequate to match the output buffer 220 (FIG. 2) output rate. By stalling the data transfer there will be no starvation of the output buffer 220 (FIG. 2).

Figure 5:
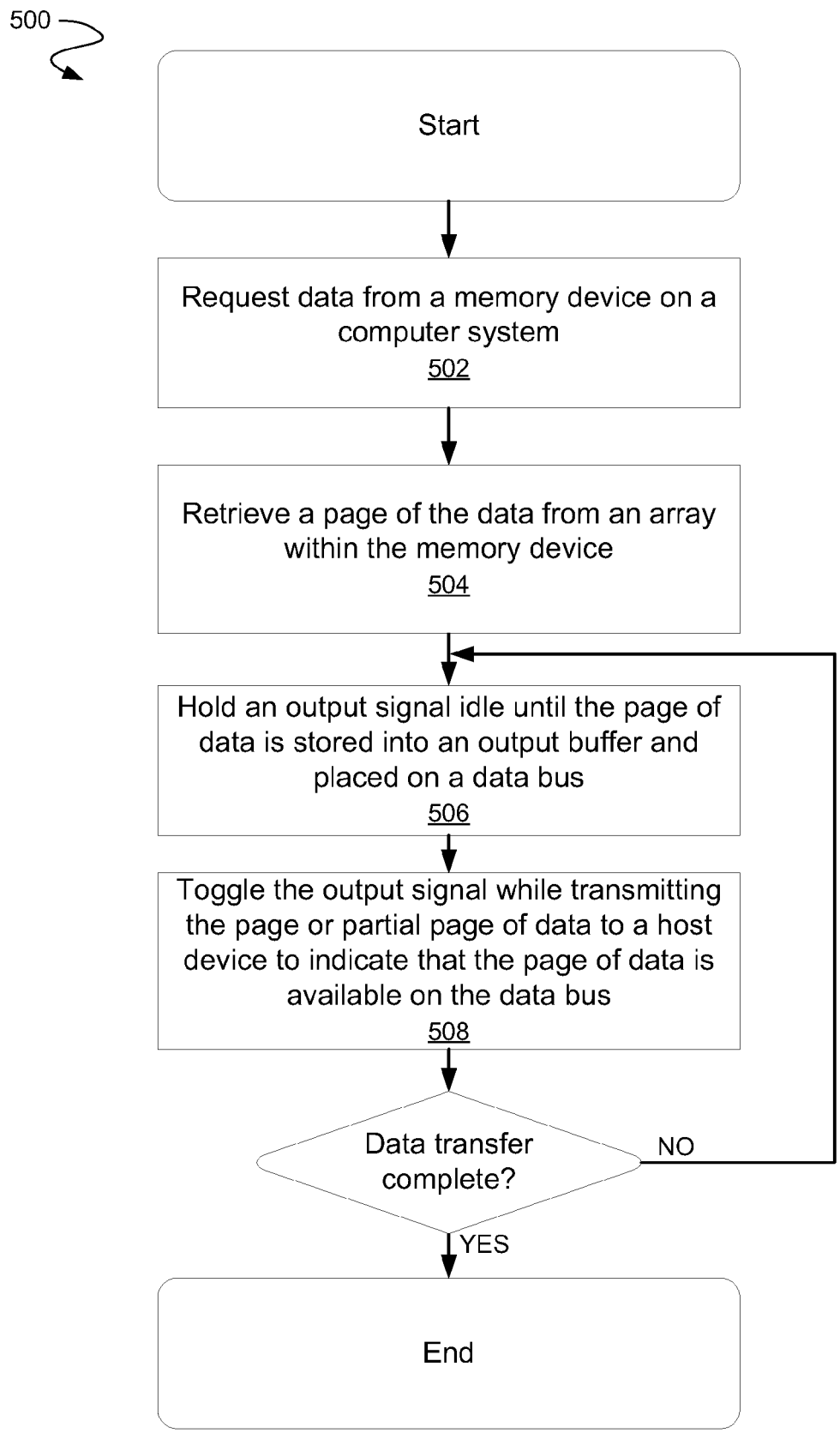
FIG. 5 depicts a flowchart of an exemplary process of supporting a continuous read burst at high clock rates, according to some embodiments of the present invention.

FIG. 5 depicts a flowchart of an exemplary process of supporting a continuous read burst at high clock rates, according to some embodiments of the present invention. In a block 502, data is requested from a memory device on a system. In some embodiments, the memory device may be a flash memory device.

For example, FIG. 3 depicts a read request specifying an initial address sent by the host device to the memory device. In some embodiments, the initial latency register is used to store a user-defined parameter. In an embodiment, this user-defined parameter is a latency time. The latency time is the number of clock cycles required to access the memory array. If the latency time is smaller than the number of clock cycles required for the output buffer to output a page of data on to the data bus, each page will be able to be extracted, stored, and transferred without a gap in the transmission (i.e. gapless transfer). However, if the latency time is larger than the number of clock cycles required for the output buffer to output a page of data on to the data bus, some sort of management is required to sustain a gapless data transfer.

In a block 504, a page of data is retrieved from the memory array within the memory device. The memory device is operable for storing data. For example, FIG. 2 depicts pages of data stored in the memory array within the memory device.

In some embodiments, the memory array stores data sequentially within a number of fixed-length contiguous blocks of virtual memory, called pages. In an embodiment, a page may be 32 Bytes of data in length. The memory array is coupled to an output buffer.

In a block 506, an output signal is held idle until the page of data is stored into an output buffer and placed on a data bus. For example, FIG. 2 depicts an output buffer coupled to the memory array within the memory device. In some embodiments, the output buffer serves to temporarily store pages of data residing in the memory array prior to transmission of the data to a host device. Each page of data is extracted from the memory array and stored into the output buffer. After extracting and storing the first page of data into the output buffer, it is advantageous to shift that page of data onto the data bus destined for the host device, while simultaneously extracting the next page of data from the memory array to be stored into the output buffer.

In some embodiments, the output signal is generated by the memory device and is operable to stall the transmission to ensure a gapless transfer of each page of data to a host device. In an embodiment, the output signal is a read data strobe. During times when the output buffer is waiting for the next page of data from the memory array, the output signal will remain idle. The output signal will remain idle until the next page of data reaches the output buffer and is placed on the data bus. Once the next page of data is available the next page will be driven onto the data bus and the output signal will toggle at a predetermined frequency. By stalling the transmission, the memory device ensures a gapless data transfer to a host device while the host continues to clock the memory device without any pauses.

In further embodiments, the pause required for an initial page of data is dependent upon the initial address for the burst transmission, page size, as well as the latency time stored in the initial latency register. The pause required for a subsequent page of data is dependent upon the page size as well as the latency time stored in the initial latency register.

In a block 508, the output signal is toggled while transmitting the page of data to a host device to indicate that the page of data is available on the data bus. For example, FIG. 3 depicts the output signal changing from an idle state to an oscillating state after the transmission of an initial page of data. In an embodiment, at the end of the initial page transfer, the output signal transitions from an idle state to an oscillating state. The output signal remains oscillating between the beginning of a subsequent page transfer and the end of a subsequent page transfer. The subsequent page of data is extracted from the memory array starting at the beginning of the page, stored in the output buffer, and transmitted to the host device between the beginning of the subsequent page transfer and the end of the subsequent page transfer. Once the data transfer between the memory device and the host device is complete, the output signal changes from the oscillating state back to the idle state, in block 506.

What is claimed is:

1. A memory device, comprising:
    a memory array operable for storing data;
    an initial latency register operable for storing a preselected latency time; and
    an output buffer coupled to said memory array, wherein said output buffer stores said data prior to a transmission of said data to a host device, wherein said memory device outputs a signal to stall said transmission until said data has been stored in said output buffer, and wherein the transmission is stalled while the output signal is idle.

2. The memory device of claim 1, wherein said data comprises an initial page of data and subsequent pages of data.

3. The memory device of claim 2, wherein said memory device is a non-volatile memory device.

4. The memory device of claim 1, wherein said latency time corresponds to the number of clock cycles required to extract a page of data from said memory array and store said page of data in said output buffer.

5. The memory device of claim 1, wherein said output signal remains idle for a number of clock cycles after said transmission of said data to said host device.

6. The memory device of claim 5, wherein said number of clock cycles is dependent on a number of clock cycles required for said transmission of said data to said host device and said latency time.

7. The memory device of claim 5, wherein said number of clock cycles is dependent on a number of clock cycles required for said transmission of said data to said host device, said latency time, and a starting address for said transmission of said data to said host device.

8. The memory device of claim 1, wherein said output signal toggles at a predetermined frequency during said transmission of said data to said host device.

9. The memory device of claim 1, wherein said transmission to said host device occurs via a data bus, said data bus operating at a frequency faster than said memory array outputs said data.

10. The memory device of claim 1, wherein said output signal is a read data strobe.

11. An apparatus, comprising:
    a memory device operable to support continuous read bursts to a host device wherein an output signal stalls a transmission from the memory device as defined by a preselected length of time, and wherein the transmission is stalled while the output signal is idle;
    a bus interface providing connectivity between said memory device and said host device; and
    a processor.

12. The apparatus of claim 11, wherein said memory device further comprises:
    a memory array operable for storing data; and
    an output buffer coupled to said memory array, wherein said output buffer stores said data prior to a transmission of said data to said host device, wherein said output signal stalls said transmission until said data has been stored in said output buffer.

13. The apparatus of claim 12, wherein:
    said output signal remains idle for a number of clock cycles after said transmission of said data to said host device; and
    said output signal toggles at a predetermined frequency during said transmission of said data to said host device.

14. The apparatus of claim 12, wherein said transmission occurs via said bus interface, said bus interface operating at a frequency faster than said memory array outputs said data.

15. A method, comprising:
    requesting data from a memory device on a computer system, wherein said memory device comprises an initial latency register storing a preselected latency time;
    retrieving a page or partial page of said data from an array within said memory device;
    holding an output signal idle until page or partial page of data is stored into an output buffer and placed on a data bus; and
    toggling said output signal while transmitting said page or partial page of data to a host device to indicate to said host device that said page or partial page of data is available on said data bus, and wherein the data transmission is stalled while the output signal is idle.

16. The method of claim 15, wherein said latency time corresponds to the number of clock cycles required to extract said page of data from said memory array and store said page of data in said output buffer.

17. The method of claim 15, wherein said holding further comprises said output signal remaining idle for a number of clock cycles after said transmission of said data to said host device.

18. The method of claim 17, wherein said number of clock cycles is dependent on a number of clock cycles required for said transmission of said data to said host device and said latency time.

19. The method of claim 17, wherein said number of clock cycles is dependent upon a number of clock cycles required for said transmission of said data to said host device, said latency time, and a starting address for said transmission of said data to said host device.

20. The method of claim 15, wherein said toggling further comprises toggling said output signal at a predetermined frequency during said transmission of said data to said host device.

* * * * *